(12) United States Patent
Spartiotis

(10) Patent No.: US 6,188,089 B1
(45) Date of Patent: Feb. 13, 2001

(54) SEMICONDUCTOR IMAGING DEVICE

(75) Inventor: Konstantinos E. Spartiotis, Helsinki (FI)

(73) Assignee: Simage Oy, Espoo (FI)

( * ) Notice: Under 35 U.S.C. 154(b), the term of this patent shall be extended for 0 days.

(21) Appl. No.: 09/069,328

(22) Filed: Apr. 29, 1998

(30) Foreign Application Priority Data

May 6, 1997 (GB) .................................................. 9709160

(51) Int. Cl.⁷ .................................................. H01L 31/00
(52) U.S. Cl. ........................ 257/188; 257/442; 257/443; 257/632
(58) Field of Search .................... 257/186, 188, 257/441, 442, 443, 632, 626

(56) References Cited

U.S. PATENT DOCUMENTS

| | | | |
|---|---|---|---|
| 3,864,722 | 2/1975 | Carnes | 357/24 |
| 4,458,260 | 7/1984 | McIntyre et al. | 357/30 |
| 4,517,464 | 5/1985 | Heath et al. | 250/370 |
| 4,783,594 | * 11/1988 | Schulte et al. | 257/443 |
| 5,412,249 | 5/1995 | Hyugaji et al. | 257/745 |

* cited by examiner

*Primary Examiner*—Minh Loan Tran
(74) *Attorney, Agent, or Firm*—Kenyon & Kenyon

(57) ABSTRACT

A semiconductor imaging device includes a semiconductor radiation detector substrate, for example of cadmium zinc telluride, with at least two faces. A first face has at least one charge output contact formed from electrically conductive material or materials and a second face having a contact formed from electrically conductive material or materials. The second face contact is for applying a bias voltage to provide an electric field between the first and second faces. The second face contact, or a third face of the semiconductor imaging device, or an edge between the second and third faces has deposited thereon at least a partial covering of a further material different from the electrically conductive material or materials of the second face contact. The deposited material can be a semiconductor, insulating or passivation material, for example aluminium nitride. Such a radiation detector can provide linear detector behaviour for all possible combinations of exposure and X-ray tube voltage.

45 Claims, 4 Drawing Sheets

SEMICONDUCTOR IMAGING DEVICE

FIELD OF THE INVENTION

The invention relates to semiconductor imaging devices comprising a semiconductor radiation detector substrate.

BACKGROUND OF THE INVENTION

In a semiconductor imaging device, a semiconductor substrate forms an active detection medium (detector), which is subdivided into detecting cells. In one form of semiconductor imaging device, for example as described in International patent application WO95/33332, the detector is joined to a readout semiconductor substrate (for example a CMOS readout chip) containing readout cells for reading from individual detector cells in a one-to-one correspondence. The detector and readout chip are flip-chip joined to each other and the readout chip is connected, by further readout electronics, to an analogue to digital converter (ADC) for providing a digitized output from each detector-readout cell.

FIG. 1A of the accompanying drawings illustrates a cross section through a radiation detector 10 for such an imaging device. A metal layer 12 is formed on the radiation entrance surface 17 of the semiconductor substrate 11. The metal layer 12 forms a bias electrode. Metal contacts 13 are formed on the opposite surface 18 of the semiconductor substrate 11 to the radiation entrance surface 17. Each of the metal contacts 13 on the surface 18 define the position of a detector cell, for example a pixel detector, within the radiation detector substrate 11 so that the radiation detector provides a position sensitive device indicating the position at which radiation enters the device.

Specifically, each detector cell provides a current or voltage output having a magnitude and/or duration representative of, and typically substantially proportional to, the magnitude and/or duration, respectively, of incident radiation 19 in the vicinity of the detecting cell. During irradiation, the metal layer 12 on the radiation entrance surface 17 is held at a constant potential (bias voltage), typically a negative potential of a few hundred Volts. Before irradiation, the metal contacts 13 are set at a different potential (for example +5 V), which should ideally be the same for all contacts in order to provide an electric field that is substantially uniform over the volume of the semiconductor substrate 11. During irradiation, the voltage at each contact 13 may decrease (for example to +2 Volts), as a result of which the electric field uniformity is not significantly perturbed.

Such imaging devices have been implemented and tested by the assignee of the current invention using different materials for the semiconductor detector substrate 11, namely silicon (Si) and cadmium zinc telluride (CdZnTe), the latter being a most attractive choice due to its significantly higher sensitivity to X-ray energies over 10 keV for a detector thickness around 1 mm.

A technique for forming metal contacts (e.g. pixels) on the semiconductor substrate 11 is disclosed in patent application No. PCT/EP96/05348 assigned to the assignee of the current invention. According to this technique, as illustrated in FIG. 1B of the accompanying drawings, metal contacts 13 are formed with the surface resistivity of the pixel contact side 18 of the detector kept high by means of a passivation layer 14 between the metal contacts 13. The passivation layer 14 minimizes leakage currents between the metal contacts 13. An example of a material for the passivation layer is aluminium nitride (AlN). Although this technique has provided detectors with high surface resistivities, other problems, not addressed in the prior art, have been observed during tests of the imaging devices.

During laboratory tests, CdZnTe detectors manufactured according to the basic teaching of PCT/EP96/05348 were tested. As a subject for the tests, rather than a single layer of metallization 12 as shown in FIGS. 1A and 1B, a metallization layer was used which comprised two metal layers 15, 16, as shown in FIG. 1C of the accompanying drawings. Each of the metal layers 15 and 16 was 50 nm thick. In some examples, the layer 15 was made of platinum (Pt) due to its better adherence to CdZnTe and the layer 16 of was made of gold (Au). During tests, the detectors 10 exhibited a non-linear response at conditions of increased exposure (high mAs setting of the X-ray tube) and/or high X-ray tube voltage settings (i.e. high incident X-ray energies). Specifically, images at such conditions have shown a saturation (maximum possible ADC value) of the output given by several detector cells. The number of saturated cell outputs increased as the exposure and/or tube voltage increased. Furthermore, with such conditions, the output values from non-saturated detector cells showed a wider spread around their mean value with a larger tail to their distribution near saturation. Moreover, the saturating cells tended to be located mostly near the detector edges.

Below saturation, the actual ADC value for each cell was proportional to the time integral of the current output of the corresponding detector element. Saturation indicated, therefore, an increased integrated (over time) current output of the detector cells. It was decided to investigate the time dependence of the current output during X-ray exposure by tracing this using an oscilloscope. The 1.5 mm thick detector was biased at −700 V and the X-ray tube was placed 90 cm above.

For exposure and tube voltage settings where the detector response was linear (no saturation problems), the total detector current output, converted into a voltage output by means of an electronic circuit, appeared as a negative square pulse on the oscilloscope. The duration of the pulse was proportional to the exposure time, and its height was proportional to the X-ray intensity incident on the detector. Since the X-ray intensity was constant during exposure, the pulse height was also substantially constant, as expected. Furthermore, the pulse edges were substantially sharp, indicating that the detector response was confined in the time window of the X-ray irradiation. Typical settings leading to this proper pulse shape included tube voltage settings under 60 kV and exposure settings under 5 mAs.

At increased exposure and tube voltage settings, the pulse shape deviated from the proper behaviour described in the previous paragraph:
(i) the pulse height was not stable—most of the time it increased over time indicating an unstable detector response to constant incident X-ray intensity;
(ii) the pulse rising (trailing) edge was not sharp indicating a slow return to zero current output after termination of X-ray irradiation—this rising (in magnitude) current output was compatible with saturation behaviour since the actual output was significantly higher than the output corresponding to incident radiation.

Typical exposure and tube voltage combinations providing such nonlinear detector response were 20 mAs and 100 kV, respectively, but the effect was observed at 1 mAs and 60 kV.

One hypothesis for explaining this nonlinear behaviour assumes a possible elimination or reduction of the Schottky potential barrier in the Schottky contact between the metallization layer and the semiconductor substrate at the radiation entrance surface. This reduction or elimination of the barrier could be caused by an excess accumulation of holes in the vicinity of the contact. Such a hypothesis is compatible with the appearance of non-linearities at large exposures and/or X-ray energies that create a large number of electron hole pairs in the semiconductor volume. The hypothesis is further supported by the fact that the nonlinear behaviour does not appear if the semiconductor material is silicon instead of CdZnTe since the metal contact on Si is formed as a P-N junction and not as a Schottky contact.

Yet further explanation of the effect may take into account the fact that saturation effects occur first for cells nearer to the detector edge. Such an effect may be due to high electric fields in the vicinity of the edges of the metallization layer 12.

It is the aim of the current invention to solve or mitigate the problems described in the previous paragraphs. Specifically, the invention aims at restoring linear detector behaviour for all possible combinations of exposure and X-ray tube voltage.

SUMMARY OF THE INVENTION

In accordance with an aspect of the invention, there is provided a semiconductor imaging device comprising a semiconductor radiation detector substrate with at least two faces, a first face having at least one charge output contact formed from electrically conductive material or materials, a second face having a contact formed from electrically conductive material or materials, the second face contact being for applying a bias voltage to provide an electric field between the first and second faces, the second face contact having deposited thereon at least a partial covering of a further material different from the electrically conductive material or materials of the second face contact.

In accordance with another aspect of the invention, there is provided a semiconductor imaging device comprising a semiconductor substrate with at least three faces, a first face having at least one charge collection contact formed from electrically conductive material or materials, a second face having a contact formed from electrically conductive material or materials, the second face contact being for applying a bias voltage to provide an electric field between the first and second faces, and a third face having deposited thereon at least a partial covering of a further material different from the electrically conductive material or materials of the second face contact.

In accordance with a further aspect of the invention, there is provided a semiconductor imaging device comprising a semiconductor substrate with at least three faces, a first face having at least one charge collection contact formed from electrically conductive material or materials, a second face having a contact formed from electrically conductive material or materials, the second face contact being for applying a bias voltage to provide an electric field between the first and second faces, and a third face which has a common edge with the first or second face, the common edge having deposited thereon at least a partial covering of a further material different from the electrically conductive material or materials of the second face contact.

Embodiments of the invention enable the problems encountered during testing of radiation detector substrates based on cadmium zinc telluride to be reduced or completely eliminated. The invention is not, however, limited to imaging devices having cadmium zinc telluride radiation detectors, but can also be applied to cadmium based radiation detectors and radiation detectors based on other materials.

In particular, a proper response of the CdZnTe detector has been observed by applying a non-metallic layer to some fraction of at least one of the detector surfaces other than the surface with the pixel metal contacts. This nonmetallic layer may be any material except for a metal or a metal alloy. Preferably, it is made of the same material as the passivation layer applied to the side with pixel metal contacts. Preferably, this material is aluminium nitride which we have used successfully on the pixel metal contact side of our CdZnTe detectors as a passivation layer (PCT/EP96/05348).

The first and second face contacts can be made of a metal or metals or metal alloys. As mentioned above, the further material comprises electrically non-conductive material and is not used for applying a bias voltage. The semiconductor material of the radiation detector substrate can be formed from one of the following: CdZnTe, CdTe, PbI, HgI, GaAs, Ge, and more particularly a cadmium based compound.

A preferred embodiment of a semiconductor imaging device comprises a plurality of radiation detector cells defined within the semiconductor substrate, each radiation detector cell having a respective charge output contact.

Preferably, the semiconductor imaging device comprises a readout substrate for receiving charge from respective radiation detector cells. In particular, the semiconductor imaging device comprises a radiation detector substrate including an array of radiation detector cells defined within the semiconductor substrate, each radiation detector cell having a respective charge output contact, and a readout substrate having an array of image cell circuits, each image cell circuit having a respective charge input contact, the radiation detector substrate and the image cell circuit substrates being bonded to each other with respective charge output and charge input contacts electrically connected to each other.

DESCRIPTION OF EMBODIMENTS OF THE INVENTION

Exemplary embodiments of the invention are described hereinafter, by way of example only, with reference to the accompanying drawings.

Figure 1A:
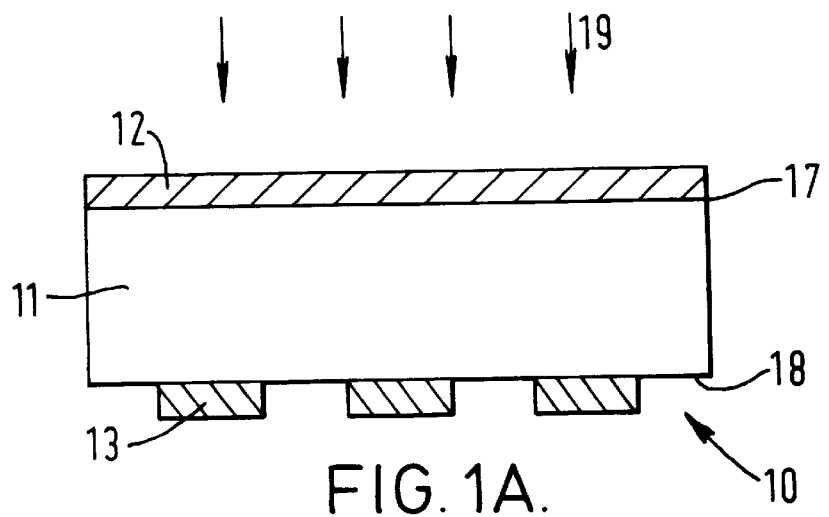
FIG. 1A is a schematic cross section of an example of a prior proposal for a radiation detector.
Figure 1B:
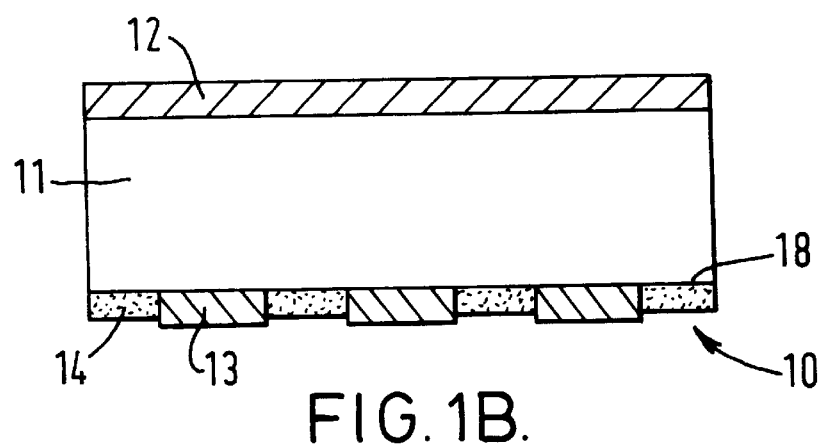
FIG. 1B is a schematic cross section of another example of a prior proposal for a radiation detector.
Figure 1C:
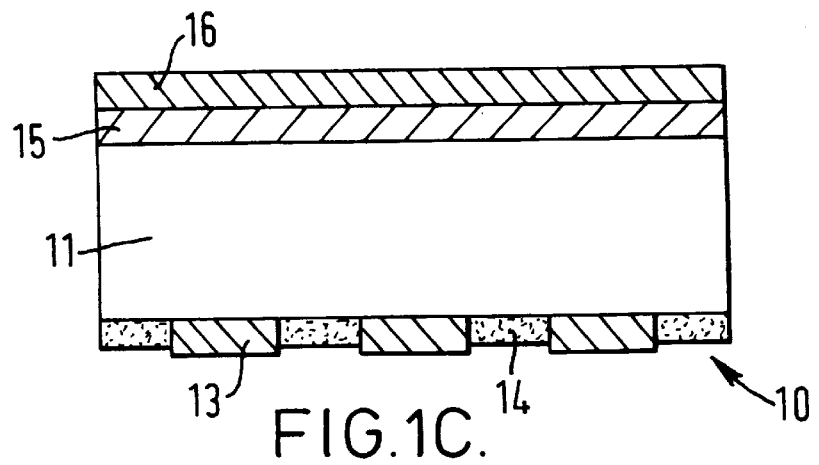
FIG. 1C is a schematic cross section of a further example of a prior proposal for a radiation detector.
Figure 2A:
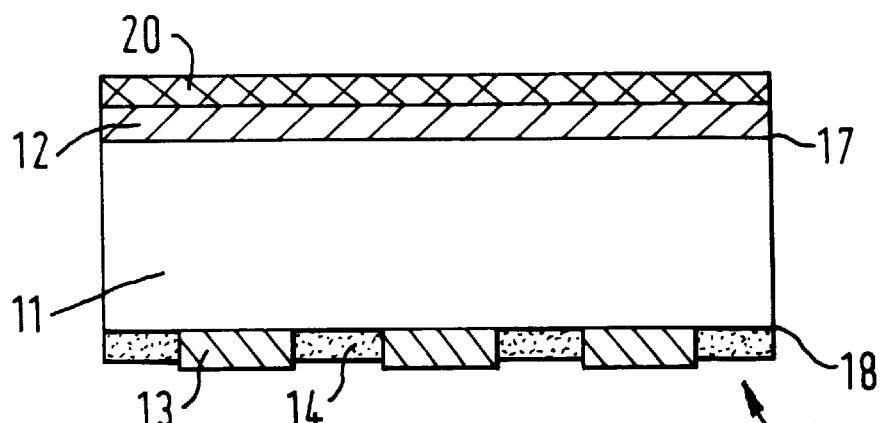
FIG. 2A is a schematic cross section of an example of a radiation detector for an embodiment of the invention.

In one embodiment of the invention, illustrated in FIG. 2A, a non-metallic layer 20 is applied over the metal layer 12 of the radiation entrance surface 17. The non-metallic layer 20 can be made of AlN, which is an appropriate passivation material for CdZnTe and CdTe. The presence of this layer may be having an electrostatic effect inhibiting the elimination or reduction of the Schottky barrier during X-ray irradiation thus restoring linear detector response. Furthermore, the non-metallic layer 20 can also be used to mechanically shield and protect the metallization layer 12 from the environment. It should be understood that the metallization layer 12 may be composite as illustrated in FIG. 1C and may comprise several metallization layers, each such layer made up from a different metal or alloy of metals. In the contact of the invention, reference will be made to "the" metallization layer without loss of generality. In other words, where reference is made to the metallization layer, it should be understood that a plurality of component layers of one or more metals or metal alloys may form the metallization layer.

Figure 2B:
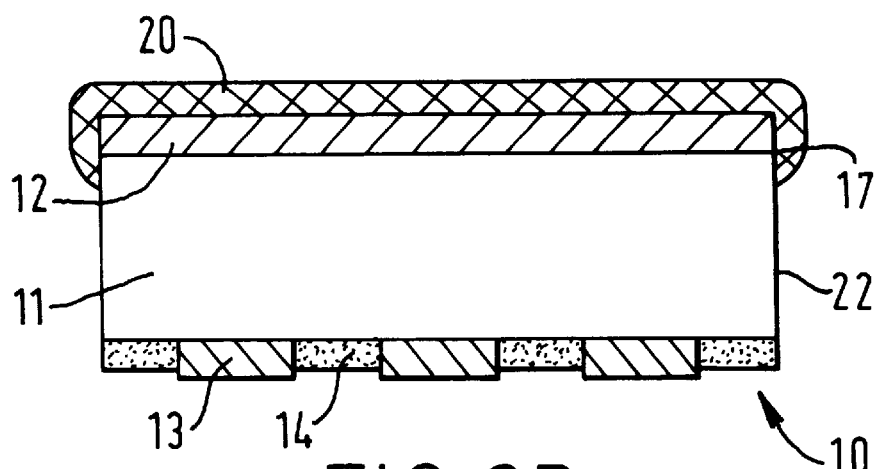
FIG. 2B is a schematic cross section of an example of a radiation detector for another embodiment of the invention.
Figure 2C:
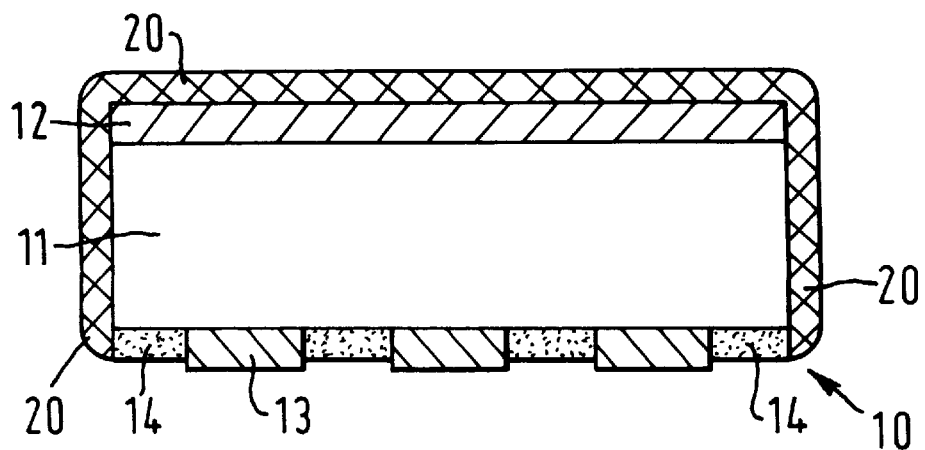
FIG. 2C is a schematic cross section of an example of a radiation detector for a further embodiment of the invention.
Figure 2D:
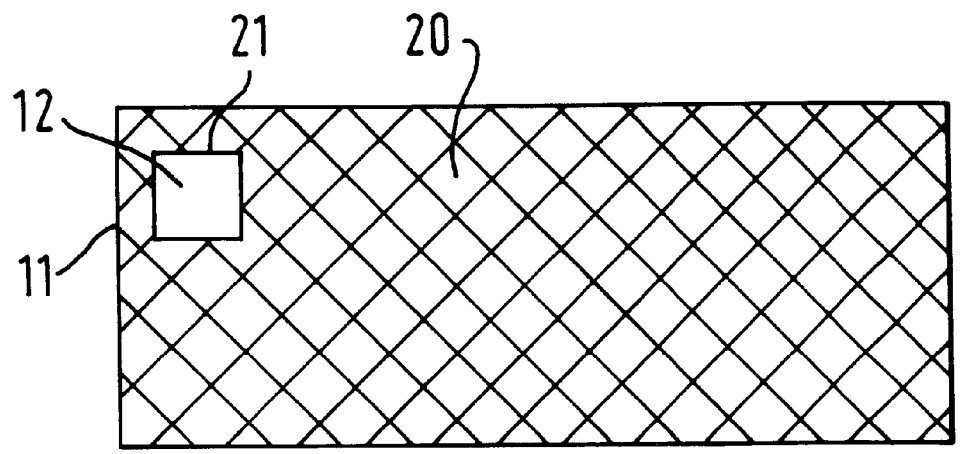
FIG. 2D is a schematic plan view of an example of a radiation detector for an embodiment of the invention.
Figure 2E:
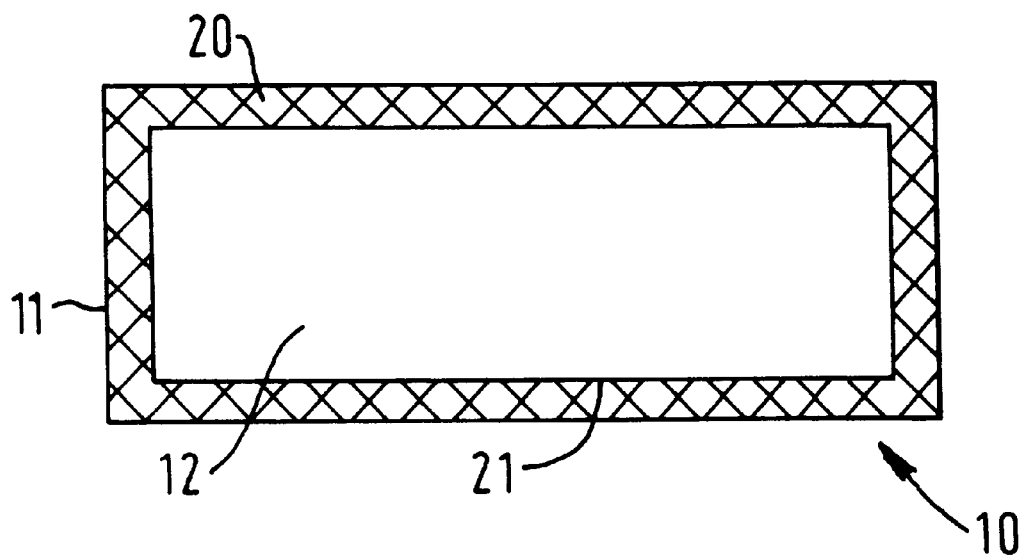
FIG. 2E is a schematic plan view of another example of a radiation detector for an embodiment of the invention.

In an example implementation of this embodiment shown in FIG. 2D, a small area 21 of this layer forming a window may not be covered with the non-metallic layer 20 for the sake of providing electrical contact between the metallization layer and the bias voltage line. The window 21 may be of any size and shape and may be located near the edge or anywhere across the non-metallic (e.g. AlN) layer 20. In one specific embodiment, this window has an area of around 1 $mm^2$, although in other embodiments it may be smaller, or larger than 1 $mm^2$. Indeed, the window 21 may be so large that the majority of the metallization layer 12 may be exposed as illustrated in FIG. 2E.

The non-metallic layer 20 can extend to one or more of the other surfaces, or sides, of the detector. An example of this is depicted in FIG. 2B, where layer 20 covers part of a surface 22 perpendicular to the radiation entrance surface 17. In the example shown in FIG. 2B, there is no unexposed edge region of the metallization layer 12 and it is possible that any effects caused by an increased electrostatic field near the metallization edge may be mitigated by the opposing effects of surface induced charges in the non-metallic layer 20. In another example, the non-metallic layer 20 extends and comes into contact with the passivation layer 14 (FIG. 2C) thus providing a detector with no exposed semiconductor material. However, some of the metallization layer 12 may be exposed through the window 21 for providing electrical connection to the bias voltage line.

The further material can be deposited by any appropriate method, for example by sputtering, evaporation or electrolysis.

Figure 3:
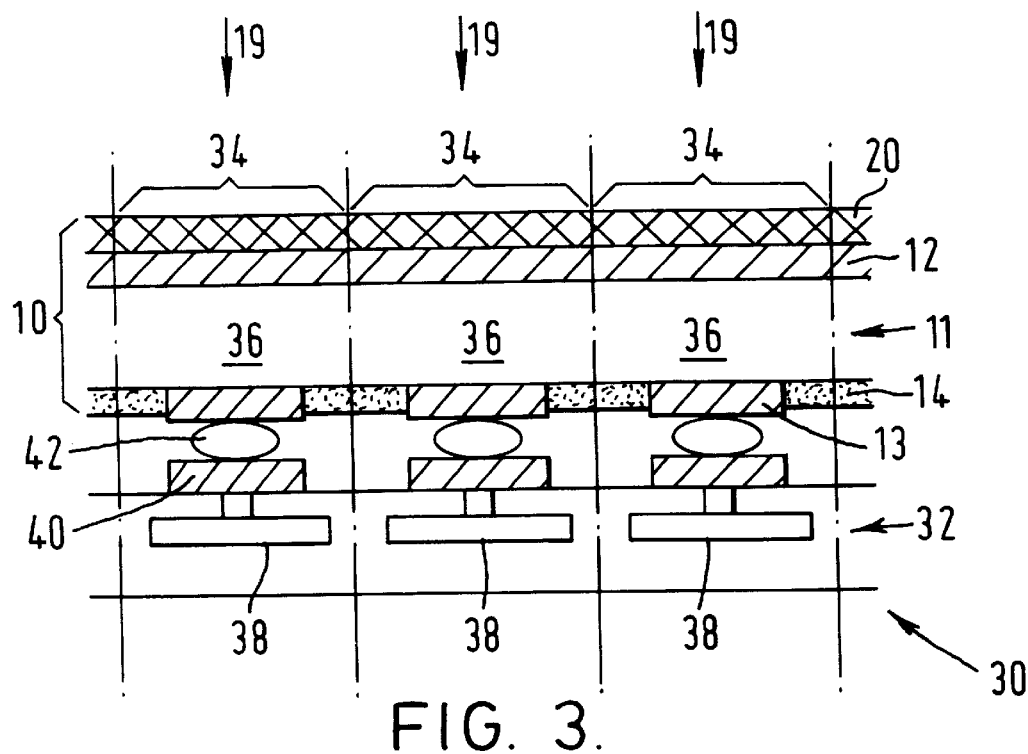
FIG. 3 is a schematic cross section of part of an imaging device according to an embodiment of the invention.

FIG. 3 is a schematic cross-section of part of an imaging device 30. In this example, the imaging device 30 comprises a radiation detector substrate 10 as described above with respect to FIG. 2A, although the radiation detector 10 could be implemented in accordance with any of the other alternatives described with reference to FIG. 2B to 2E above. It also comprises a readout semiconductor substrate 32. A radiation detector cell (e.g., a pixel cell) 34 of the radiation detector 10 comprises a radiation detection zone 36 defined on the detector substrate 11 by the continuous electrode 12 to which is applied a biasing voltage in use and metal contacts 13. The metal contacts 13 provide charge output contacts for outputting charge from the detector cells which result from radiation hits in the area of the detection zone 36 for the detector cell 34. Corresponding image cell (e.g. pixel cell) circuits 38 on the readout substrate 32 are defined at locations corresponding to the electrodes 34 (i.e. to the pixel detectors 19). Each image cell circuit 38 is provided with a charge input contact 40 electrically connected to a corresponding charge output contact 13 by bump-bonds 42. In this manner, when charge is generated in an image detector cell 34 in response to incident radiation, this charge is passed via the contact 13, the bump-bond 42 and the contact 40 to the corresponding image cell circuit 38. The image cell circuits could be simple readout circuits. However, in a preferred embodiment of the invention they form charge accumulation circuits, whereby the readout substrate 32 could be of the form described in International patent application No. WO95/33332. Although only a few image cells are shown in FIG. 3, the semiconductor imaging device will typically include a large array of image cells (typically configures as pixel cells). Moreover, although in particular embodiments of the invention the semiconductor imaging device is intended for imaging high energy radiation, for example X-rays having energies in excess of 1 keV, the invention is not limited in its application to devices for imaging radiation of such energies.

Figure 4:
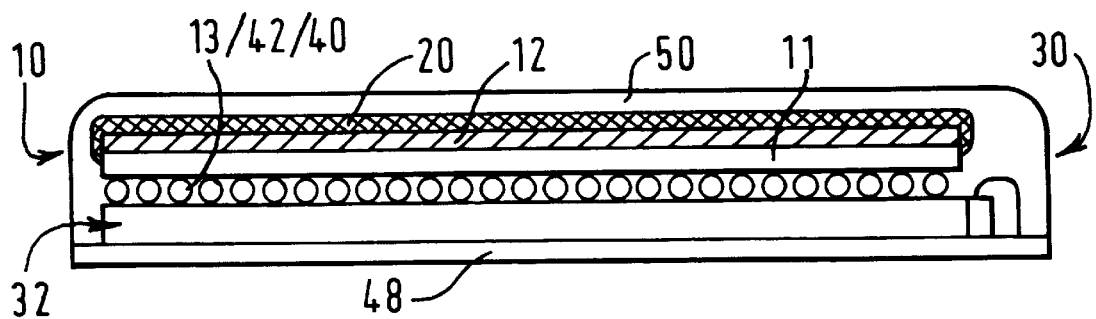
FIG. 4 is a schematic cross section of an embodiment of an imaging device according to the invention.

FIG. 4 is a schematic diagram of an imaging device 30 of the type shown in FIG. 3 mounted on a support 48 and contained in encapsulation material 50. The imaging device encapsulation 50 can be of any suitable conventional form, using materials transparent to the radiation to be imaged. The encapsulation, which is typically of an insulating material, is separate from said further material and will not be deposited layer.

Although particular embodiments of the invention have been described, it will be appreciated that many additions and/or modifications and/or alternatives can be envisaged within the scope of the invention. It will be appreciated that any of the detectors described with reference to FIGS. 2A–2E may be combined with any form of readout substrate. Indeed readout could be provided in a manner other than that described above.

Different embodiments and aspects of the invention may be used independently or in combination. While the invention has shown to restore proper response of CdZnTe detectors to X-rays at energies from 10 keV–150 keV and X-ray exposures from 0.1 mAs to more than 300 mAs, it is foreseen that the invention is suitable for any cadmium based compound semiconductors or other compound semiconductors. Also other appropriate materials, besides aluminium nitride, can be used as an extra layer on top of the bias contact.

What is claimed is:

1. A semiconductor imaging device for imaging high energy radiation comprising a semiconductor radiation detector substrate with at least two faces, a first face having at least one charge output contact formed from electronically conductive material or materials, a second face having a contact formed from electrically conductive material or materials, said second face contacts being for applying a bias voltage to provide an electric filed between said first and second faces, said second face contact having deposited thereon at least a partial covering of a further material different from said electrically conductive material or materials of said second face contact, the further material inhibiting saturation of said device during operation thereof.

2. A semiconductor imaging device according to claim 1, wherein said further material is not used for applying a bias voltage.

3. A semiconductor imaging device according to claim 1, wherein said first and second face contacts are made of a metal or metals or metal alloys.

4. A semiconductor imaging device according to claim 1, wherein said further material comprises a non-metallic material.

5. A semiconductor imaging device according to claim 1, wherein said further material comprises electrically non-conductive material.

6. A semiconductor imaging device according to claim 5, wherein said further material forms an electrically non-conductive layer or partial layer.

7. A semiconductor imaging device according to claim 1, wherein said further material comprises a semiconductor material.

8. A semiconductor imaging device according to claim 1, wherein said further material comprises electrically insulating material.

9. A semiconductor imaging device according to claim 8, wherein said further material forms an electrically insulating layer or partial layer.

10. A semiconductor imaging device according to claim 1, wherein said further material comprises passivation material.

11. A semiconductor imaging device according to claim 10, wherein said further material comprises aluminium nitride.

12. A semiconductor imaging device according to claim 11, wherein said further material is aluminium nitride.

13. A semiconductor imaging device according to claim 1, wherein said further material is deposited by sputtering, evaporation or electrolysis.

14. A semiconductor imaging device according to claim 1, wherein said radiation detector substrate is formed from one of the following:

CdZnTe, CdTe, PbI, HgI, GaAs, Ge.

15. A semiconductor imaging device according to claim 1, wherein said semiconductor imaging device is formed from a cadmium based compound.

16. A semiconductor imaging device according to claim 1, comprising a plurality of radiation detector cells defined within said radiation detector substrate, each radiation detector cell having a respective charge output contact.

17. A semiconductor imaging device according to claim 1, additionally comprising a readout substrate for receiving charge from respective radiation detector cells.

18. A semiconductor imaging device according to claim 17, comprising a radiation detector substrate including an array of radiation detector cells defined within said radiation detector substrate, each radiation detector cells having a respective charge output contact, and a readout substrate having an array or image cells circuits, each image cell circuit having a respective charge input contact, said radiation detector substrate and said readout substrate being bonded to each other with respective said charge output and charge input contacts electrically connected to each other.

19. A semiconductor imaging device according to claim 1, wherein said semiconductor imaging device is encapsulated.

20. A semiconductor imaging device for imaging high energy radiation comprising a semiconductor substrate with at least three faces, a first face having at least one charge collection contact formed from electrically conductive material or materials, a second face having a contact formed from electrically conductive material or materials, said second face contact being for applying a bias voltage to provide an electric field between said first and second faces, and a third face disposed transverse to said first and second faces and having deposited thereon at least a partial covering of a further material different from said electrically conductive material or materials of said second face contact, the further material inhibiting saturation of said device during operation thereof.

21. A semiconductor imaging device according to claim 20, wherein said first and second face contacts are made of a metal or metals or metal alloys.

22. A semiconductor imaging device according to claim 20, wherein said further material comprises a non-metallic material.

23. A semiconductor imaging device according to claim 20, wherein said further material comprises electrically non-conductive material.

24. A semiconductor imaging device according to claim 20, wherein said further material comprises a semiconductor material.

25. A semiconductor imaging device according to claim 20, wherein said further material comprises electrically insulating material.

26. A semiconductor imaging device according to claim 20, wherein said further material comprises passivation material.

27. A semiconductor imaging device according to claim 20, wherein said further material is deposited by sputtering, evaporation or electrolysis.

28. A semiconductor imaging device according to claim 20, wherein said semiconductor substrate is formed from one of the following: CdZnTe, CdTe, PhI, HgI, GaAs, Ge.

29. A semiconductor imaging device according to claim 20, wherein said semiconductor imaging device is formed from a cadmium based compound.

30. A semiconductor imaging device according to claim 20, comprising a plurality of radiation detector cells defined within said semiconductor substrate, each radiation detector cell having a respective charge output contact.

31. A semiconductor imaging device according to claim 20, additionally comprising a readout substrate for receiving charge from respective radiation detector cells.

32. A semiconductor imaging device according to claim 20, wherein said semiconductor imaging device is encapsulated.

33. A semiconductor imaging device for imaging high energy radiation comprising a semiconductor substrate with at least three faces, a first face having at least one charge collection contact formed from electrically conductive material or materials, a second face having a contact formed from electrically conductive material or materials, said second face contact being for applying a bias voltage to provide an electric field between said first and second faces, and a third face disposed transverse to said first and second faces and which has a common edge with said first or second face, said common edge having deposited thereon at least a partial covering of a further material different from said electrically conductive material or materials of said second face contact, the further material inhibiting saturation of said device during operation thereof.

34. A semiconductor imaging device according to claim 33, wherein said first and second face contacts are made of a metal or metals or metal alloys.

35. A semiconductor imaging device according to claim 33, wherein said further material comprises a non-metallic material.

36. A semiconductor imaging device according to claim 33, wherein said further material comprises electrically non-conductive material.

37. A semiconductor imaging device according to claim 33, wherein said further material comprises a semiconductor material.

38. A semiconductor imaging device according to claim 33, wherein said further material comprises electrically insulating material.

39. A semiconductor imaging device according to claim 33, wherein said further material comprises passivation material.

40. A semiconductor imaging device according to claim 33, wherein said further material is deposited by sputtering, evaporation or electrolysis.

41. A semiconductor imaging device according to claim 33, wherein said semiconductor substrate is formed from one of the following: CdZnTe, CdTe, PbI, HgI, GaAs, Ge.

42. A semiconductor imaging device according to claim 33, wherein said semiconductor imaging device is formed from a cadmium based compound.

43. A semiconductor imaging device according to claim 33, comprising a plurality of radiation detector cells defined within said semiconductor substrate, each radiation detector cell having a respective charge output contact.

44. A semiconductor imaging device according to claim 33, additionally comprising a readout substrate for receiving charge from respective radiation detector cells.

45. A semiconductor imaging device according to claim 33, wherein said semiconductor imaging device is encapsulated.

* * * * *